United States Patent
Toner

[11] Patent Number: 6,039,234
[45] Date of Patent: Mar. 21, 2000

[54] MISSING WIRE DETECTOR

[75] Inventor: Eugene M. Toner, Quakertown, Pa.

[73] Assignee: Kulicke & Soffa Investments, Inc., Wilmington, Del.

[21] Appl. No.: 09/097,792

[22] Filed: Jun. 16, 1998

[51] Int. Cl.[7] .......................... B23K 37/00; B23K 13/08; B23K 31/00; B23K 31/02
[52] U.S. Cl. ................ 228/4.5; 228/8; 228/102; 228/180.5
[58] Field of Search .................... 228/102, 103, 228/104, 110.1, 1.1, 4.5, 180.5, 8

[56] References Cited

U.S. PATENT DOCUMENTS

| | | | |
|---|---|---|---|
| 4,213,556 | 7/1980 | Persson et al. | 228/104 |
| 4,341,574 | 7/1982 | Landes | 156/64 |
| 4,555,052 | 11/1985 | Kurtz et al. | 228/104 |
| 4,558,596 | 12/1985 | McBrearty et al. | |
| 4,586,642 | 5/1986 | Dreibelbis et al. | |
| 4,597,519 | 7/1986 | Kurtz et al. | 228/102 |
| 4,606,490 | 8/1986 | Chan et al. | 228/103 |
| 4,771,930 | 9/1988 | Gillotti et al. | |
| 4,786,860 | 11/1988 | Zimmerman | |
| 4,888,514 | 12/1989 | Takahashi et al. | 310/316 |
| 5,083,087 | 1/1992 | Fox et al. | 324/537 |
| 5,213,249 | 5/1993 | Long et al. | 228/102 |
| 5,238,173 | 8/1993 | Ura et al. | 228/104 |
| 5,357,423 | 10/1994 | Weaver et al. | 364/148 |
| 5,463,197 | 10/1995 | Miyazaki | 219/56.22 |
| 5,645,210 | 7/1997 | Toner et al. | 228/102 |
| 5,890,643 | 4/1999 | Razon et al. | 228/1.1 |
| 5,893,508 | 4/1999 | Oh | 228/4.5 |
| 5,900,690 | 5/1999 | Gipson et al. | 310/316 |

*Primary Examiner*—Patrick Ryan
*Assistant Examiner*—Kiley Stoner
*Attorney, Agent, or Firm*—Ratner & Prestia

[57] ABSTRACT

A method and apparatus for monitoring the presence of a bonding wire in a wire bonding machine. The apparatus generates an AC signal which is coupled to the bonding tool. A sensor senses a current of the AC signal flowing to the bonding tool and a current of the AC signal returned from the bonding tool. The current flows are compared to one another to determine the presence or absence of the bonding wire in the bonding tool.

22 Claims, 4 Drawing Sheets

MISSING WIRE DETECTOR

BACKGROUND OF THE INVENTION

This invention relates generally to fine wire bonders employed to make electrical connections between electrodes or pads on semiconductor devices and lead out pads. More specifically, the present invention relates to a novel apparatus for detecting the presence of a bonding wire between the bonding tool and the electrode or pad of the semiconductor device during the bonding process.

DESCRIPTION OF THE RELATED ART

Automatic wire bonders are known in the semiconductor manufacturing industry. A commercially available processor controlled automatic wire bonder is made by Kulicke and Soffa Industries, Inc. and is shown and described in U.S. Pat. No. 4,266,710. The wedge bonding mechanism for an automatic wedge wire bonder also commercially available from Kulicke and Soffa Industries, Inc. is shown and described in U.S. Pat. No. 4,239,144.

Heretofore, it was common practice to assign an attendant to one or more automatic wire bonders. These high-speed wire bonders complete an interconnection of fine wire between a first and second bond position in approximately 250 milliseconds. If the fine wire breaks and/or is not properly fed from the wire feed to the bonding tool, a tail of proper length is not positioned below the working face of the bonding tool to permit a proper bonding operation on the next bond. Numerous problems occur which can cause a wire to be missing from the working face of a bonding tool. In addition, other problems occur which cause the first or second bond to be made improperly or to become disconnected from the pad or terminal on which it is made. If the attendant responsible for an automatic wire bonder is responsible for detecting the numerous errors which can and do occur a large number of semiconductor devices could be processed or operated on by the automatic wire bonder before the attendant could become aware of the problem and shut the machine down. After making the first error, the bonding tool can continue to attempt to make bonds at the first and second bond position without making a good wire interconnection. If wire is missing under the working face of a bonding tool when the bonder attempts to make a subsequent first and second bond, the bonding tool can crash into the terminal pads on the semiconductor device and/or destroy the lead out pads especially when ultrasonic scrubbing is employed. Ultrasonic scrubbing of pads and terminals with a bare bonding tool will damage the electrodes.

Attempts have been made to monitor the condition of a bond at the time it is being made by an ultrasonically driven bonding tool. The prior art devices have monitored the drive current as well as the impedance of the bonding transducer to determine if the bonds being made by the bonding tool are properly attached to the terminals or pads. Through a complex analysis of the changes in impedance relative to the bonding time, such prior art systems have been able to determine with some accuracy whether the first and/or second bond was properly made. The prior art devices required a first subsystem to detect the presence of the bonding wire and a second subsystem to supply ultrasonic energy to the transducer and the wedge. U.S. Pat. Nos. 4,341,574 and 3,852,999 are typical of systems which measure the impedance of the transducer to determine whether the bonds are properly attached to the terminals or pads.

Heretofore, the conductance of a fine wire interconnection has been measured during a complete bonding operation. The prior art systems employed for monitoring a bonding operation, however, have employed a DC voltage source which has been applied to the fine wire. These prior art systems included some means for measuring current changes in the fine wire. This required that the fine wire be insulated or isolated at the wire feed and that the fine wire be grounded at the semiconductor or the work station. The bonding tool and wire feed were insulated so that the current path from the voltage source was directed through the fine wire to the pad or electrode on the device to ground. Some of these prior art devices required that the conductive path be reversed so that current would flow through the semiconductor device being tested. If the voltage source of the prior art conductive devices could be made stable, changes in the current observed were proportional to the impedance of the fine wire plus the impedance of the device being bonded which includes capacitive and resistive components. These prior art systems would ground the fine wire by making contact to the semiconductor device and by providing a path to ground.

In these prior art systems in which the first bond and the second bond must be grounded. Problems occur in that sensing the interconnection after the first bond becomes extremely difficult using conductive impedance measuring instruments or current sensing devices. Attempts to raise the voltage or current in the fine wire to generate larger current flow so as to provide larger values for detection quite often become harmful to the device and can cause destruction of more sensitive devices. Since some electrodes or pads on the devices are more sensitive than others, it was necessary to shut off or disconnect the monitoring system to prevent damage to these devices. For example, the gates of field effect transistors (FETs) have very high impedance and can be easily destroyed with small amounts of current. Other devices having high impedance also cannot be tested properly due to the very small current changes induced into the prior art conductive monitoring systems. CMOS devices have a very small input capacitance and are easily destroyed if current and voltage sources are raised too high. Other types of devices cannot be tested without reversing the polarity of the current flow. When the device under test presents a high capacitive time constant, the device can continue to charge after the first bond is made and create false indications of bad bonds due to decaying current flow. Any speed-up of detection before the device and circuit is fully charged is a compromise which could easily fail to detect some types of improper fine wire interconnections.

SUMMARY OF THE INVENTION

In view of the shortcomings of the prior art, it is an object of the present invention to monitor the presence of a fine wire at the bond point without the need for a DC voltage source or separate detection and excitation subsystems. Such a monitor would be commercially desirable if it would work with various types of semiconductor devices without the need to change the voltage source for the ultrasonic transducer and it may not be necessary to avoid certain terminals on the semiconductor device. Such a wire bond monitor would be extremely desirable if it was inexpensive, simple and structured so as to be incorporated into existing automatic wire bonders without requiring modifications which would change the mode of operation on automatic wire bonders. Further, it would be desirable if the wire bond monitor would provide a miniaturized structure which could be easily incorporated into the existing automatic wire bonders and would not be affected by thermal changes and vibrations of the bonding transducer or rapid movement of the bonding head.

The present invention is a device for use with a bonding tool for monitoring the presence of a bonding wire, the device comprises generator means for generating an AC excitation signal, coupling means for coupling the AC excitation signal to the bonding tool, sensing means for sensing a first current of the AC excitation signal and a second current from the coupling means, comparing means for comparing the first current and the second current, and generating an output signal, and determining means for determining the presence of bonding wire based on the output signal of the comparing means.

The present invention also relates to a method for detecting the presence of a bonding wire in the bonding tool comprising the steps of generating an AC excitation signal, coupling the AC excitation signal to the bonding tool, sensing a first current representative of the AC excitation signal and a second current representative of a return signal from the coupling means, and determining the presence of the bonding wire based on the first and second currents.

According to another aspect of the invention, the comparison of the first current and second current generates a warning signal indicating that the bonding wire is absent from the bonding tool.

According to still another aspect of the invention, the comparison of the first current and second current automatically halts the operation of the bonding tool when the bonding wire is absent from the bonding tool.

According to yet another aspect of the present invention, the AC excitation signal is used as the ultrasonic bonding signal for the ultrasonic transducer and as the reference signal for determining the presence of the bonding wire in the bonding tool.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

In the manufacture of semiconductor devices, individual circuits or die are interconnected with a substrate, such as a chip package, using very thin wires. One method of attaching these wires to the pads of the die and the pads of the chip package is by using an ultrasonic bonder. The ultrasonic bonder uses high frequency energy to scrub the bonding wire on the pad which effectively "welds" the wire to the pad. If the bonding wire is absent when the pad is "scrubbed" the pad my be irreparably damaged.

Figure 1:
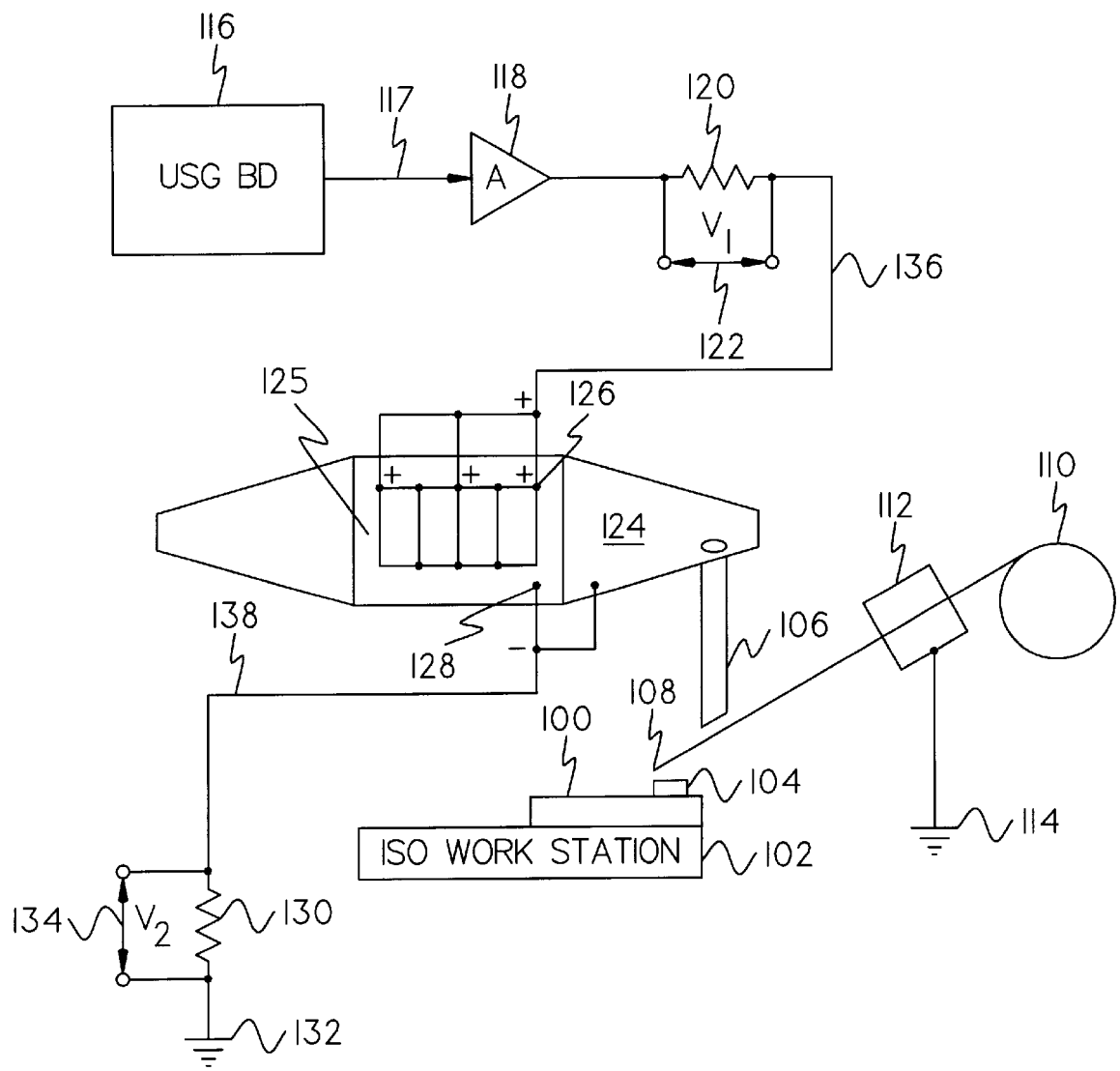
FIG. 1 is a block diagram of an exemplary embodiment of the present invention.

Referring to FIG. 1, an exemplary embodiment of the present invention is shown. In FIG. 1, semiconductor device 100 is placed on an isolated workstation 102. As part of the manufacturing process, bonding wire 108 is to be connected between pad 104 of semiconductor device 100 and a pad of a package or substrate (not shown). To this end, bonding wire 108 is supplied by supply reel 110 and bonded to pad 104 by wedge 106 of ultrasonic transducer 124. Workstation 102 is isolated from ground or any other reference so that electrical energy present at wedge 106 of the bond head (not shown) is not conducted through semiconductor device 100.

Ultrasonic transducer 124 has an ultrasonic element 125, such as a piezoelectric element for example, contained therein. An AC excitation signal is supplied by ultrasonic generator 116 to input 126 of ultrasonic element 125. The excitation signal has a frequency of between 50 to 200 KHz, and more preferably about 60 KHz or about 120 KHz. The excitation signal extends and contracts ultrasonic transducer 124 in the longitudinal direction through ultrasonic generator 116 which in turn moves wedge 106 across the surface of pad 104 with bonding wire 108 between pad 104 and wedge 106. The frequency an which the wedge 106 is scrubbed across pad 104 creates localized heating which in turn transfers molecules between the pad and bonding wire 108 resulting in an effective bond.

The excitation signal 117 from ultrasonic element 125 is amplified by amplifier 118 and provided to input 126 of ultrasonic element 125 via resistor 120 as excitation signal 136. Voltage 122 across resistor 120 represents the current drawn from amplifier 118 of excitation signal 136. The value of resistor 120 is selected such that an accurate measurement of current is achieved without unnecessarily reducing the level of the excitation signal. It is contemplated that the value of resistor 120 may be between about 0.1 ohms and 10 ohms with a preferable value of about 2 ohms. Excitation signal 136 is conducted to both ultrasonic element 125 and wedge 106. A portion of excitation 136 is provided at output 128 of ultrasonic element 125 and coupled to one end of resistor 130 through return path 138. The other end of resistor 130 is connected to ground reference 132. The voltage across resistor 130 represents the current returned from ultrasonic element 125 based on excitation signal 136. The value of resistor 130 may be selected to be about the same value of resistor 120. Ultrasonic transducer 124 is also isolated from any ground reference so that current from excitation signal 136 is not drained which may result in erroneous measurements through return path 138.

As mentioned above, excitation signal 136 is also conducted to wedge 106. As the ultrasonic transducer 124 starts the bonding process, wedge 106 is lowered to contact bonding wire 108 and pad 104. If bonding wire 108 is present, a conductive path exists between wedge 106 and ground reference 114 through bonding wire 108 and clamp 112. This conductive path reduces the portion of excitation signal 136 returned via return path 138. This reduction in the current of the returned excitation signal is measured as voltage 134 across resistor 130. If the voltage 134 is less that voltage 120 by about 15% the presence of bonding wire 108 is confirmed. This percentage may vary based on factors such as signal to noise ratio.

On the other hand, if bonding wire 108 is not present, the conductive path to ground reference 114 is interrupted. In this case nearly all of excitation signal 136 (other than that dissipated by ultrasonic element 125) is returned to ground reference 132 through return path 138. This increased signal is measured as voltage 134. The absence of bonding wire is determined if voltage 134 is within about 15% of the voltage 120. In this way the current inherent in excitation signal 136 is used to determine the presence of bonding wire 108.

Figure 2:
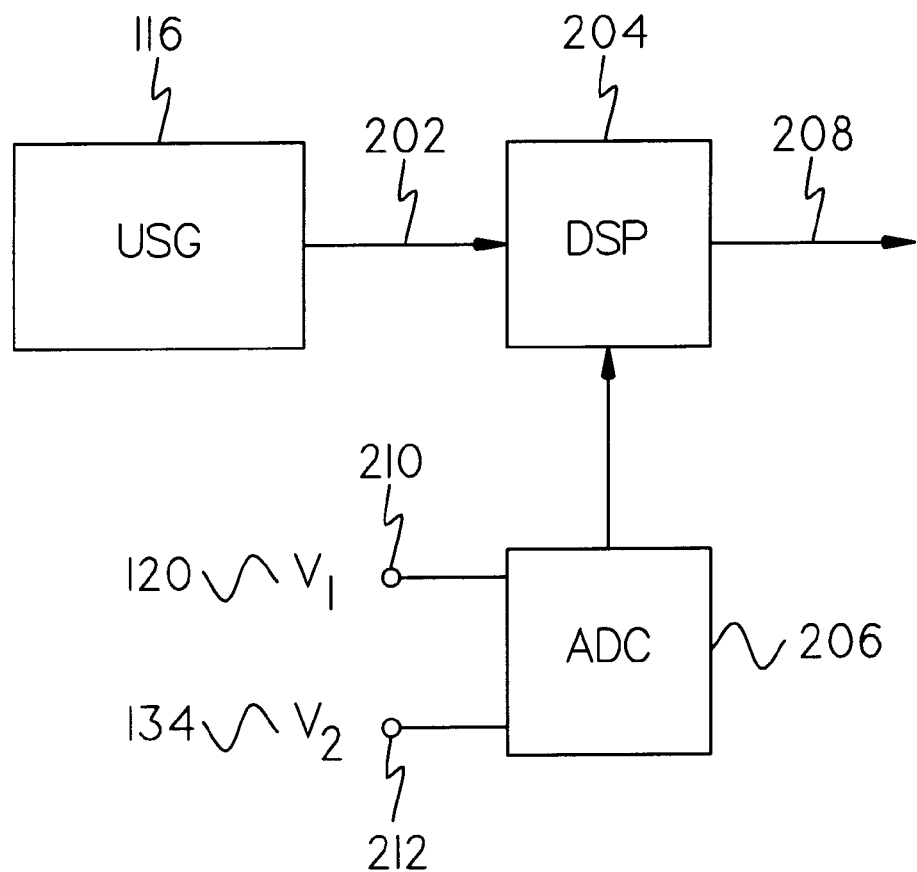
FIG. 2 is a partial block diagram of the exemplary embodiment of the present invention.

Referring now to FIG. 2, a block diagram of a control circuit of the present invention is shown. As shown in FIG. 2, ultrasonic generator 116 generates a control signal 202 to digital signal processor (DSP) 204. Voltage 120 and voltage 134, which represent the source current and return current of excitation signal 136, respectively, are input to analog to digital converter (ADC) 206 "through inputs 210 and 212, respectively". ADC 206 converts the analog voltage signals 120 and 134 into digital representations and provides these digital representations to DSP 204. DSP 204 determines the difference in the source and return currents and if the difference between theses currents is less than about 15%, DSP 206 generates warning signal 208 as an alert that bonding wire 108 is absent. If the difference between the currents is greater than about 15% DSP 204 determines that bonding wire 108 is present and warning signal 208 is not generated.

Figure 3:
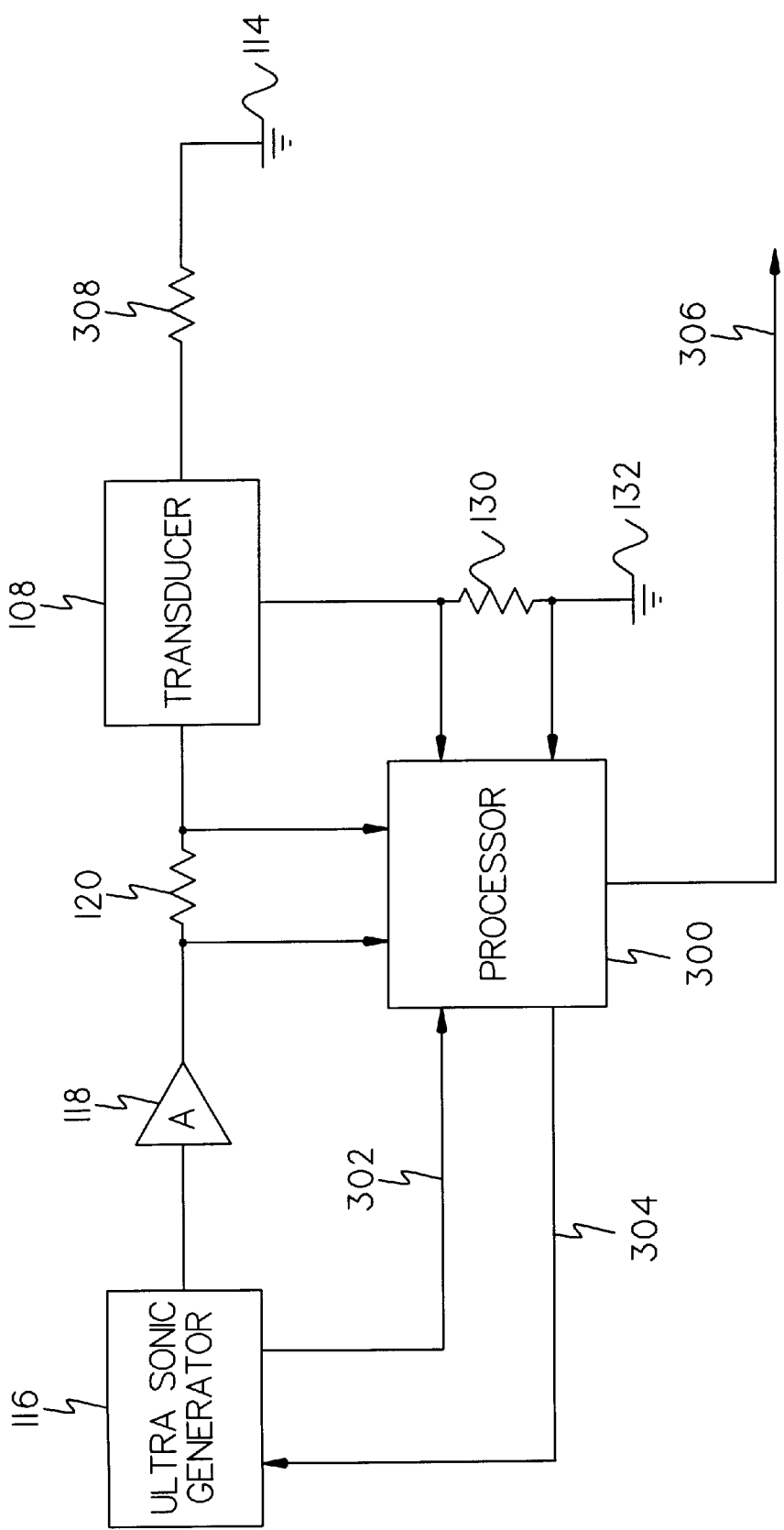
FIG. 3 is a partial schematic diagram of a second exemplary embodiment of the present invention.

Referring now to FIG. 3, a block diagram of a second exemplary embodiment of the present invention is shown. As shown in FIG. 3, ultrasonic generator 116 is coupled to amplifier 118 and processor 300. Ultrasonic generator 116 provides signal 302 to processor 300 to indicate that a bonding operation is in progress. Processor 300 is coupled to resistors 120 and 130 to determine if bonding wire 108 (shown as resistive element 308 in FIG. 3) is present. If processor 300 determines that bonding wire 108 is not present (based on the above discussed criteria) processor 300 generates halt signal 304 to ultrasonic transducer 116 to terminate the generation of excitation signal 136. In addition, processor 300 may also generate a further signal 306 which may be a warning signal, another process termination signal or status signal for use with other processing equipment (not shown).

Figure 4:
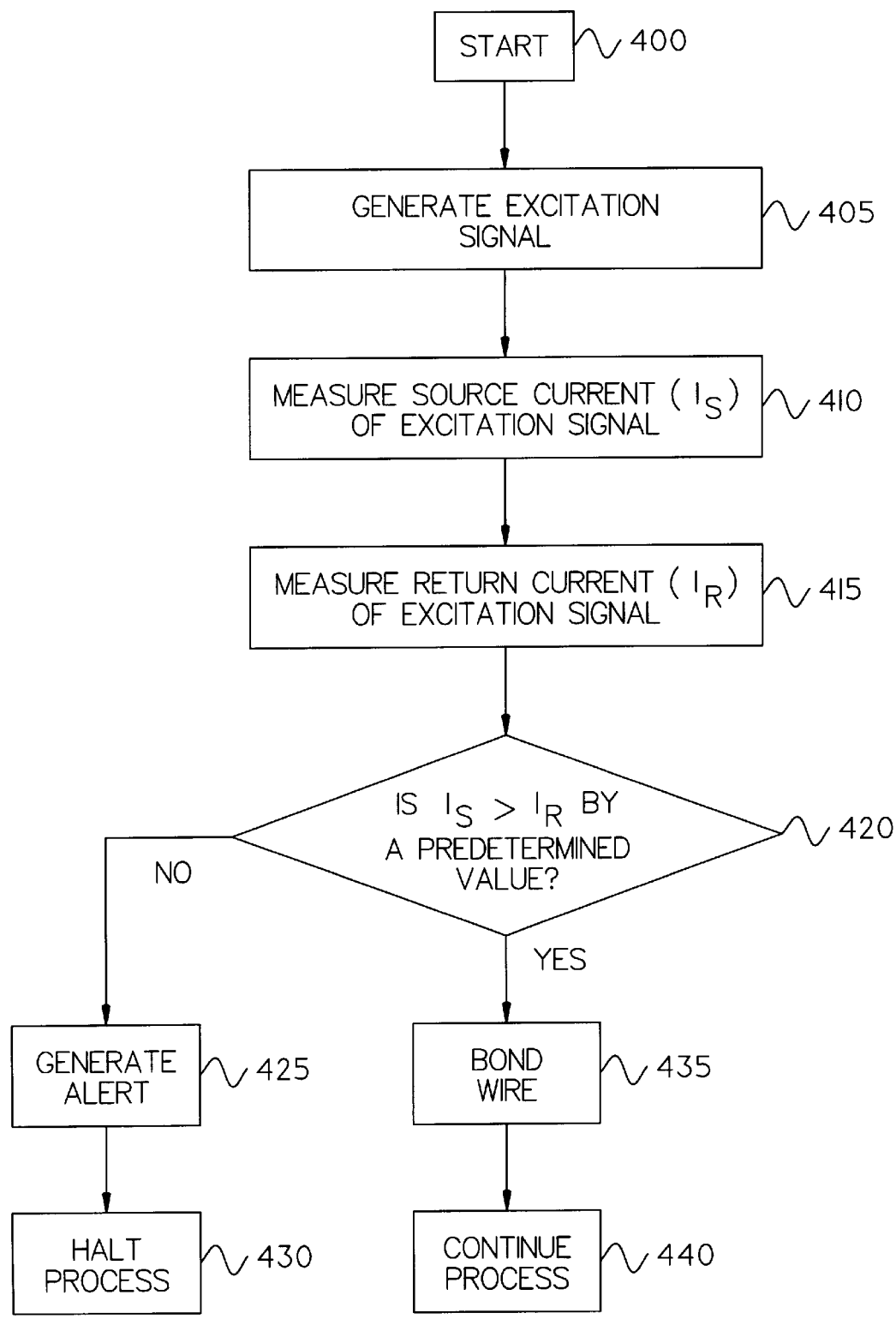
FIG. 4 is a flow chart of an exemplary embodiment of the present invention.

Referring to FIG. 4, a flow chart of an exemplary process of the present invention is shown. In FIG. 4, at Step 400, the bonding process is started. At Step 405, the excitation signal is generated by the ultrasonic generator. At Step 410, the source current of the excitation signal is measured. At Step 415, the return current of the excitation signal is measured.

At Step 420, the source current and return current are compared to one another. If the source current is greater than the return current by a predetermined value Step 425 is entered, otherwise Step 435 is entered. At Step 425, an alert is issued indicting the absence of the bonding wire and at Step 430, the bonding process is halted. Alternatively, at Step 435 the bond is formed and at Step 440, the process continues.

In addition to, or in place of the above mentioned alert, a signal may be generated to control the bonder based on a determination that the bonding wire is missing. The signal may halt the operation of the bonder in a non-destructive, restartable manner, for example. In addition, the alert generated at Step 425 may take the form of a visual alert and/or an audible alert.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A device for use with a bonding tool for monitoring the presence of a bonding wire before the bonding wire is applied to a workpiece, the device comprising:

generator means for generating an AC signal;

coupling means for coupling the AC signal to the bonding tool;

sensing means for sensing a first current of the AC signal and a second current from the coupling means;

comparing means for comparing a difference between the first current and the second current, and generating an output signal based on the difference; and determining means for determining the presence of bonding wire based on the output signal of the comparing means, wherein the workpiece is isolated so that the AC signal does not conduct through the workpiece.

2. A device according to claim 1, wherein the AC signal has a frequency of between about 50 KHz and 200 KHz.

3. A device according to claim 1, wherein the generator means is an ultrasonic generator.

4. A device according to claim 1, wherein the AC signal has a frequency of about 60 KHz.

5. A device according to claim 1, wherein the AC signal has a frequency of about 120 KHz.

6. A device according to claim 1, wherein the coupling means is an ultrasonic transducer.

7. A device according to claim 1, wherein the sensing means is a resistor.

8. A device according to claim 7, wherein the resistor has a value ranging from about 0.1 ohm to 10 ohms.

9. A device according to claim 7, wherein the resistor has a value of about 2 ohms.

10. A device according to claim 1, wherein the comparing means includes an analog to digital converter.

11. A device according to claim 1, wherein the determining means is a digital signal processor.

12. A device for use with a bonding tool for monitoring the presence of a bonding wire, the device comprising:

an oscillator to generate a first signal;

a first current sensor coupled to the oscillator to sense a first current based on the first signal;

a distributor to provide at least a portion of the first current to the bonding tool;

a second current sensor coupled to the distributor to sense a second current output from the distributor; and a comparator for comparing a difference between the first current and the second current, wherein the workpiece is isolated so that the first signal does not conduct through the workpiece.

13. A device according to claim 12, wherein the comparator generates a signal indicative of the presence of the bonding wire in the bonding tool based on the difference between the first current and the second current.

14. A device for use with a bonding tool for monitoring the presence of a bonding wire before the bonding wire is applied to a workpiece, the device comprising:

an ultrasonic generator for generating an AC signal;

a first resistor coupled to the ultrasonic generator;

an ultrasonic transducer, an input of the ultrasonic transducer coupled to the first resistor, for receiving the AC signal generated by the ultrasonic generator; and a second resistor coupled to an output of the ultrasonic transducer and a reference, the resistor providing a return path for at least a first portion of the AC signal, wherein the presence of the bonding wire provides a second return path between the transducer and the reference for a second portion of the AC signal, and the workpiece is isolated from the reference.

15. The device according to claim 14, further comprising:

a converter coupled to the first resistor and the second resistor to convert a first voltage and a second voltage representative of a respective current flow into a digital representation.

16. The device according to claim 15, further comprising:
a processor coupled to the converter for receiving the digital representation and determining whether the bonding wire is present in the bonding tool.

17. The device according to claim 16, wherein the processor generates an error signal based on the absence of the bonding wire.

18. The device according to claim 14, further comprising a metallic wedge coupled to the transducer for coupling a second portion of the AC signal to the bonding wire, wherein if the bonding wire is present, a value of the first portion of the AC signal is reduced by a value corresponding to a value of the second portion of the AC signal.

19. A device for use with a bonding tool for monitoring the presence of bonding wire, the device comprising:
generator means for generating an AC signal;
coupling means for coupling the AC signal to the bonding tool as an input signal;
sensing means for sensing a first current of the AC signal input to the bonding tool and a second current output from the coupling means;
comparing means for comparing a difference between the first current and the second current, and generating an output signal based on the difference; and
determining means for determining the presence of bonding wire based on the output signal of the comparing means.

20. A device according to claim 19, wherein the presence of the bonding wire provides a return path between the distributor and a reference for a further portion of the signal.

21. A device for use with a bonding tool and a semiconductor device for monitoring the presence of bonding wire before the bonding wire is applied to the semiconductor device, the device comprising:
generator means for generating an AC signal;
coupling means for coupling the AC signal to the bonding tool as an input signal;
sensing means for sensing a first current of the AC signal input to the bonding tool and a second current output from the coupling means;
comparing means for comparing a difference between the first current and the second current, and generating an output signal based on the difference; and
determining means for determining the presence of bonding wire based on the output signal of the comparing means,
wherein the semiconductor device is isolated so as not to conduct any portion of the AC signal through the semiconductor device.

22. A device for use with a bonding tool and a semiconductor device for monitoring the presence of a bonding wire, the device comprising:
a generator to generate an AC signal;
a transducer for coupling the AC signal to the bonding tool;
a sensor for sensing a first current of the AC signal input to the transducer and a second current output from the transducer;
a comparator to i) compare the first current and the second current and ii) generate an output signal;
an isolator to isolate the semiconductor device from the AC signal; and
determining means for determining the presence of the bonding wire based on the output signal of the comparing means.

* * * * *